United States Patent

Nussbaum et al.

[11] Patent Number: 5,952,947
[45] Date of Patent: Sep. 14, 1999

[54] FLEXIBLE AND PROGRAMMABLE DELTA-SIGMA ANALOG SIGNAL CONVERTER

[75] Inventors: Howard S. Nussbaum, Los Angeles; William P. Posey, Palos Verdes; Joseph J. Jensen, Malibu; Gopal Raghavan, Canoga Park, all of Calif.

[73] Assignee: Raytheon Company, Lexington, Mass.

[21] Appl. No.: 08/925,954

[22] Filed: Sep. 9, 1997

[51] Int. Cl.⁶ .................................................. H03M 3/00
[52] U.S. Cl. .............................................................. 341/143
[58] Field of Search ............................................. 341/143

[56] References Cited

U.S. PATENT DOCUMENTS

| | | | |
|---|---|---|---|
| 4,953,184 | 8/1990 | Siimone | 375/103 |
| 5,621,345 | 4/1997 | Lee et al. | 327/254 |
| 5,841,388 | 11/1998 | Yasuda et al. | 341/155 |

*Primary Examiner*—Howard L. Williams
*Attorney, Agent, or Firm*—Leonard A. Alkov; Glenn H. Lenzen, Jr.

[57] ABSTRACT

Processing apparatus is provided that directly samples and quantizes a complex envelope of a bandlimited waveform centered at a predetermined carrier frequency. An oversampling delta-sigma modulator 1 samples and quantizes the input signal to a single bit data stream. A serial-to-parallel converter converts the single bit data stream into a parallel bit stream. A digital decimation filter digitally filters the parallel bit stream to produce an estimate of the baseband in-phase and quadrature components of the input signal. In-phase and quadrature video filters generate in-phase and quadrature samples that are output from the analog signal converter. A controller 26 and a plurality of digital-to-analog converters 25 are used to center noise shaping nulls of the delta-sigma modulator around the carrier frequency. The controller sets the spacing between nulls of the serial-to-parallel converter to maximize the signal-to-noise ratio of the analog signal. The controller controls the decimation filter to set the sample times of thereof to sample the carrier in quadrature so that the coefficients are programmed to form a bandpass filter at the carrier frequency and programs the coefficients of the video filters to form bandpass filters at the decimated carrier frequency.

8 Claims, 2 Drawing Sheets

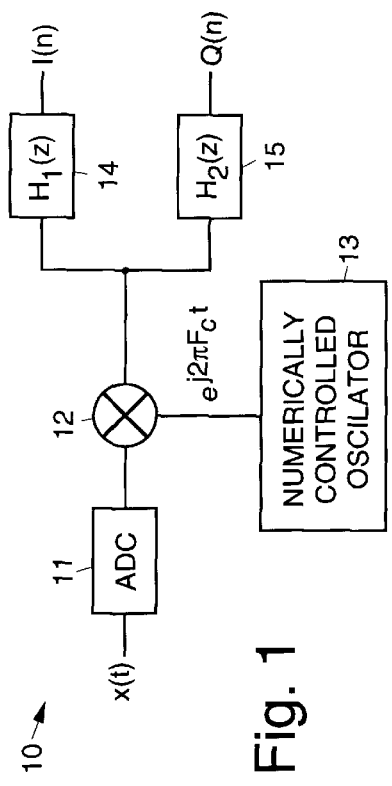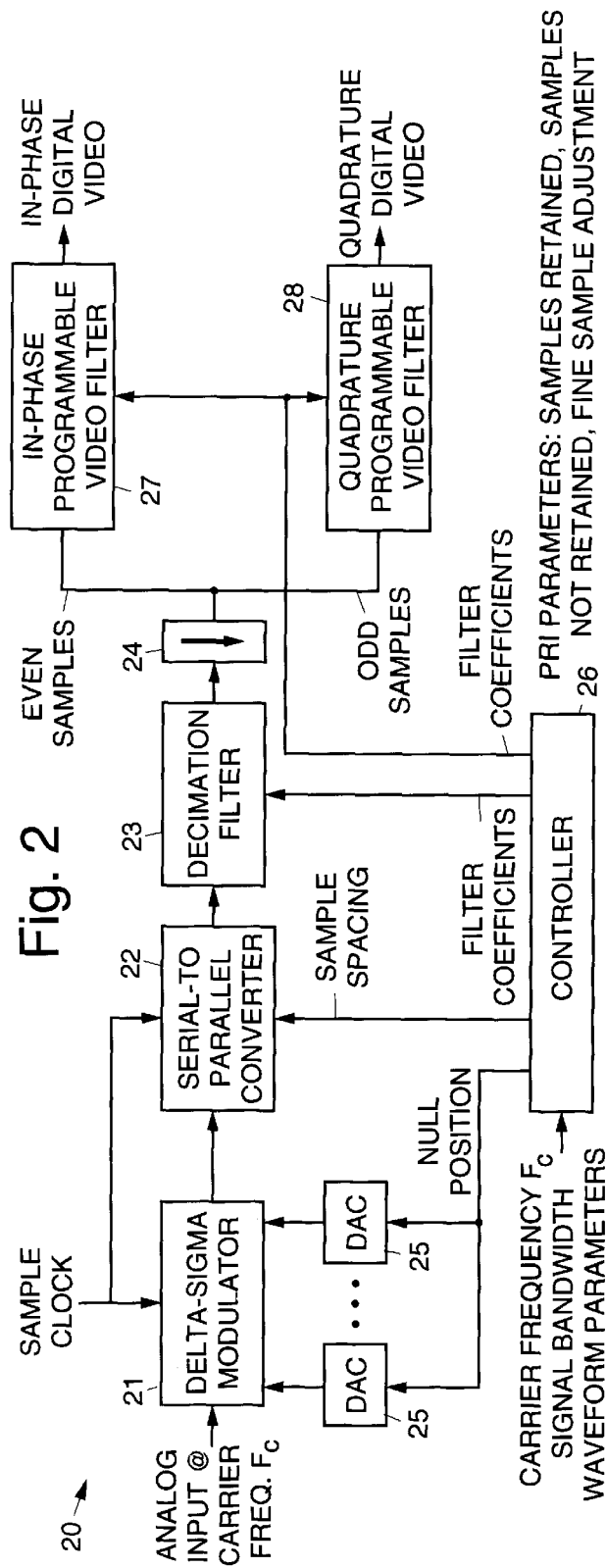

FLEXIBLE AND PROGRAMMABLE DELTA-SIGMA ANALOG SIGNAL CONVERTER

BACKGROUND

The present invention relates generally to delta-sigma analog signal converters, and more particularly, to an analog signal converter having an delta-sigma modulator and programmability.

One conventional approach for sampling and quantizing a complex envelope of a bandlimited waveform uses a multi-bit analog-to-digital converter and tunable digital oscillator. This approach requires an analog-to-digital converter sampling above the Nyquist rate determined by the highest frequency signal to be converted, followed by a complex frequency translation to baseband and a digital low pass filter. A numerically controlled oscillator supplies the frequency translator with a variable reference and provides for tunability. A fundamental limitation of this approach is that the fidelity of the analog-to-digital converter decreases as the carrier frequency increases. Another drawback is that as the carrier frequency is increased a significant amount of high speed signal processing is required.

Schemes using a bandpass delta-sigma modulator and digital filtering tuned to a fixed frequency and fixed signal bandwidth relative to the sample rate have been described. For example, see H. J. Dressler: "Interpretative Bandpass A/D Conversion—Experimental Results" *Electron. Lett.* vol. 26, no. 20, pp. 1652–1653, Sep. 27, 1990, R. Schreier and M. Snelgrove, "Decimation for bandpass sigma-delta analog-to-digital conversion", *Proc. Int Symp. Circuits Syst.*, vol. 3, May 1990, pp. 1801–1804, and G. Troster, et al, "An interpolative bandpass converter on a 1.2 $\mu$m BiCMOS analog/digital array", *IEEE Journal of Solid State Circuits*, pp. 471–477, April, 1993.

Accordingly, it is an objective of the present invention to provide for an improved analog signal converter having a delta-sigma modulator and programmability.

SUMMARY OF THE INVENTION

To meet the above and other objectives, the present invention provides for a flexible approach that directly samples and quantizes a complex envelope of a bandlimited waveform centered at a predetermined carrier frequency $F_c$. $F_c$ may be a radio frequency (RF) or intermediate frequency (IF) of a radar, electronic support measure or communications system.

More specifically, the present analog signal converter comprises an oversampling delta-sigma modulator that samples and quantizes the input signal to a single bit data stream. A serial-to-parallel converter converts the single bit data stream into a parallel bit stream. A digital decimation filter digitally filters the parallel bit stream to produce an estimate of the baseband in-phase and quadrature components of the input signal. In-phase and quadrature video filters generate in-phase and quadrature samples that are output from the analog signal converter. A controller and a plurality of digital-to-analog converters are used to center noise shaping nulls of the delta-sigma modulator around the carrier frequency. The controller sets the spacing between the noise shaping nulls to maximize the signal-to-noise ratio of the final in-phase and quadrature samples. The controller controls the decimation filter to set the filter's sample times to sample the carrier in quadrature, programs the coefficients of the decimation filter to form a bandpass filter at the carrier frequency and programs the coefficients of the video filters to form bandpass filters at the decimated carrier frequency.

The analog signal converter avoids analog-to-digital converter dynamic range limitations by using the oversampling delta-sigma modulator in place of a conventional Nyquist rate analog-to-digital converter. The noise shaping of the delta-sigma modulator is electronically adjustable allowing high fidelity conversion of signals with center frequencies below the sample rate. The analog signal converter also uses a novel digital signal processing scheme that takes advantage of the high degree of oversampling provided by the delta-sigma modulator to tune to any carrier frequency below the limit of the delta-sigma modulator operating range without the need for an explicit frequency translation and without additional complexity beyond normal noise rejection filtering.

The analog signal converter may be electronically programmed over a wide range of input signal bandwidths and carrier frequencies. This allows the analog signal converter to support a variety of system applications, and makes it suitable for applications with dynamically varying waveform parameters, such as a multimode radar, electronic support measure, or spread spectrum communication system. The analog signal converter incorporates a dynamically tunable delta-sigma modulator covered in a companion disclosure.

The advantages of directly sampling a bandlimited RF or IF signal to obtain the in-phase and quadrature components versus sampling after analog down conversion to baseband are well known. The present invention performs high fidelity direct in-phase and quadrature conversion over a wide range of dynamically selectable carrier frequencies.

BRIEF DESCRIPTION OF THE DRAWINGS

The various features and advantages of the present invention may be more readily understood with reference to the following detailed description taken in conjunction with the accompanying drawings, wherein like reference numerals represent like structural elements, and in which FIG. 1 illustrates a conventional processor for developing in-phase and quadrature samples;

FIG. 2 illustrates an analog signal converter in accordance with the principles of the present invention.

FIG. 4b illustrates an I/Q multiplier accumulator bank used in the I and Q video filters of FIG. 4a.

DETAILED DESCRIPTION

Figure 3:
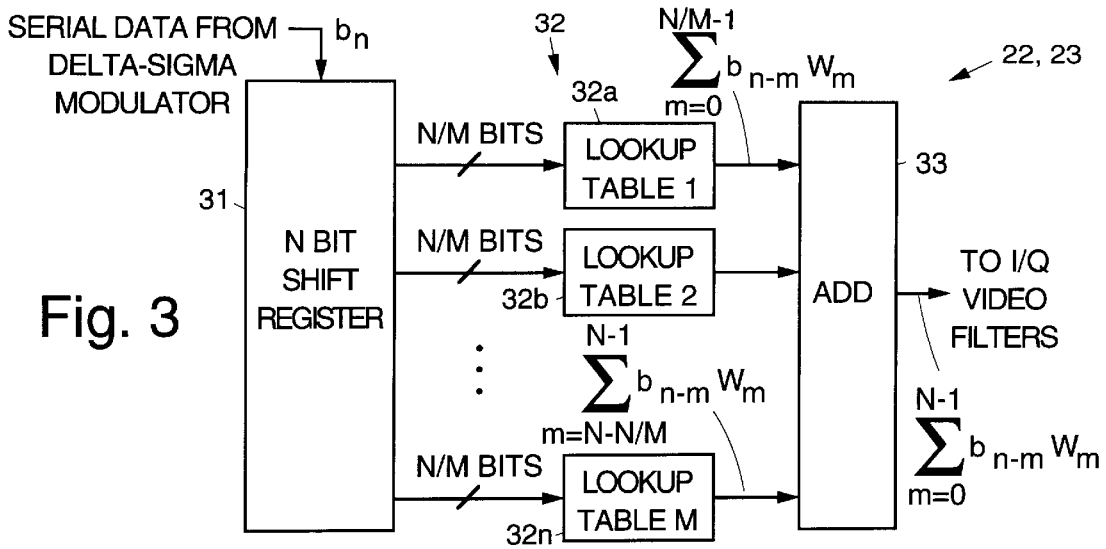
FIG. 3 illustrates a serial-to-parallel converter and decimation filter architecture used in the analog signal converter of FIG. 2.

Referring to the drawing figures, FIG. 1 illustrates conventional processor 10 for developing in-phase and quadrature samples. The conventional processor 10 uses an analog-to-digital converter (ADC) 11 that samples above the Nyquist rate determined by the highest frequency signal to be converted, followed by a complex frequency translation to baseband (provided by a translator 12) and a digital low pass filter 14, 15. A numerically controlled oscillator 13 that supplies the frequency translator 12 with a variable reference provides for tunability. A fundamental limitation of this processor 10 is that the fidelity of the analog-to-digital converter 11 decreases as the carrier frequency increases. Another drawback is that as the carrier frequency is increased a significant amount of high speed signal processing is required.

FIG. 2 shows a block diagram of an exemplary analog signal converter 20 in accordance with the principles of the present invention. The input signal to the analog signal converter 20 is a bandlimited signal at the carrier frequency $F_c$. The input signal is first sampled and quantized to a single bit by a bandpass delta-sigma modulator 21. Nulls in the quantization noise are positioned near $F_c$ in the signal band by setting the gain of transconductance amplifiers in a noise shaping filter in the delta-sigma modulator. The gain of the transconductance amplifiers are set by the bias current supplied by digital-to-analog converters (DACs) 25. The noise shaping nulls provided by the delta-sigma modulator 21 are dynamically "tuned" in response to the desired signal bandwidth and $F_c$ by controlling the digital-to-analog converters 25.

The delta-sigma modulator 21 is followed by a serial-to-parallel converter 22 and a digital decimation filter 23 that digitally filters the signal output of the delta-sigma modulator 21. The decimation filter 23 is also "tuned to match the signal and characteristics of the delta-sigma modulator 21. The decimation filter 23 rejects out of band quantization noise of the delta-sigma modulator 21 and produces a high precision estimate of the baseband in-phase and quadrature components of the input signal. Since the analog signal converter 20 relies on a high degree of oversampling relative to the signal bandwidth, the digital filtering is most efficiently accomplished in two stages wherein a sample rate reduction 24 is provided as part of the decimation filter 23. The decimation filter 23 must provide enough rejection to prevent out-of-band noise aliasing from degrading the output signal-to-noise ratio.

FIG. 3 illustrates the architecture of the serial-to-parallel converter 22 and decimation filter 23 used in the analog signal converter 20. The serial-to-parallel converter 22 and decimation filter 23 employs an N bit shift register 31, and plurality of lookup tables 32 and adders 33 as shown in FIG. 3. The decimation filter 23 takes advantage of the fact that the output of the delta-sigma modulator 21 is a single bit data stream. The single bit serial output stream of the delta-sigma modulator 21 is first converted to an N bit parallel word by the serial-to-parallel converter 22 which is used to address a lookup table 32. This provides a flexible and programmable implementation of a finite impulse response (FIR) bandpass filter while avoiding the need for multiplications. Since N is likely to be too large for practical memory sizes, the lookup table 32 may be broken into a number of partial sums (provided by multiple lookup tables $32a, \ldots 32n$ to reduce the overall memory size. In this way, the complexity of the filter is reduced, allowing the filter coefficients $W_n$, not to be severely quantized or restricted in value as in many implementations.

The output sample times of the decimation filter 23 are determined by the number of input samples allowed to propagate through an input shift register 31 between memory lookups. If the time spacing between alternate output samples is set to an odd integer multiple of one quarter of a carrier period, even output samples of the decimation filter 23 may be taken as the in-phase component of the input signal and odd output samples as the quadrature component. While these samples represent the in-phase and quadrature components of the input signal, they cannot be combined into a complex sample since they are taken at different sample times. This spacing may require that the decimation filter 23 produce data that is non-uniformly spaced (i.e., $x(0), x(T), x(4T), x(5T), x(8T), x(9T) \ldots$). This non-uniformly, but regular spacing is easily produced with the decimation filter 23. A simple structure to produce the "even" and "odd" data streams is to use two decimation filters 23 that produce the two separate data streams: ($x(0), x(4T), x(8T) \ldots$) and ($x(1), x(5T), x(9T) \ldots$).

The remaining problem is then one of taking the output of the decimation filter 23 and producing in-phase and quadrature sample pairs. This is accomplished by in-phase and quadrature video filters 27, 28 which also provide passband shaping and additional noise rejection that allow a further sample rate reduction (decimation). If the time spacing between samples does not meet the above requirements, then the in-phase and quadrature video filters 27, 28 will have complex coefficients and the outputs of the filters 27, 28 are then combined to form the in-phase and quadrature samples.

Figure 4A:
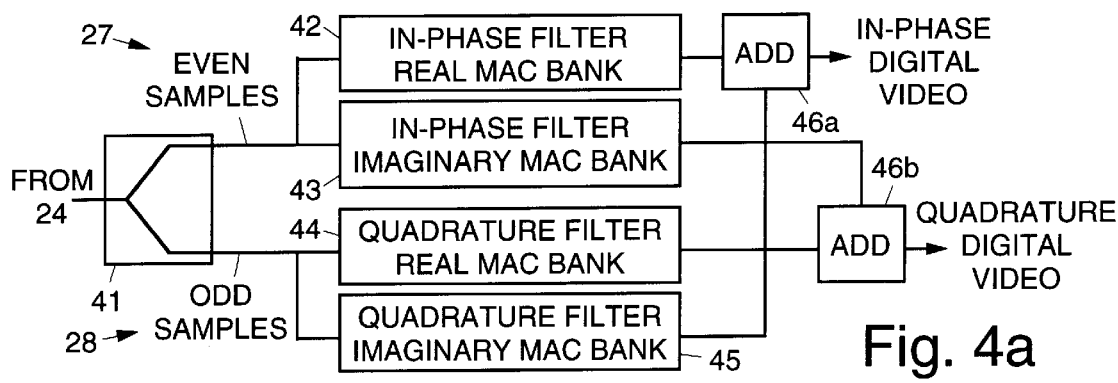
FIG. 4a illustrates an architecture of an I/Q video filter used in the analog signal converter of FIG. 2.
Figure 4B:
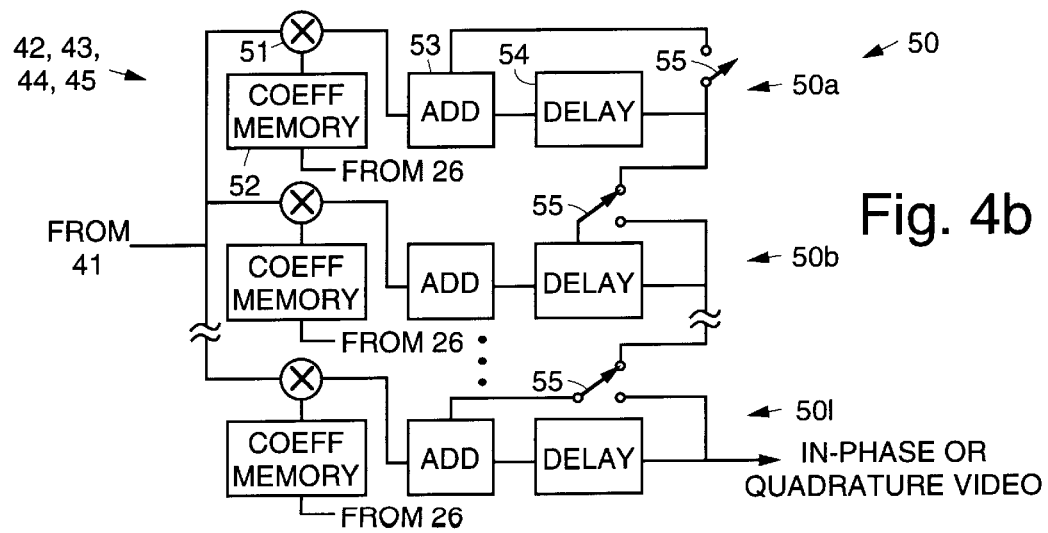

FIG. 4a illustrates the architecture of the in-phase and quadrature video filters 27, 28 used in the analog signal converter 20, and FIG. 4b illustrates an in-phase and quadrature multiplier accumulator bank 50 used in the in-phase and quadrature video filters 27, 28. The unique structure of the in-phase and quadrature video filters 27, 28 supports variable bandwidths and decimation ratios (D) while keeping the rate of arithmetic operations constant. The filters 27, 28 are constructed using a plurality of filters termed multiplier-accumulator banks 42, 43, 44, 45 that are selectively coupled to first and second adders 46a, 46b. The in-phase and quadrature video filter 27, 28 each has a real and imaginary part to support complex coefficients. Even and odd samples are routed by a multiplexer 41 to respective in-phase real and imaginary multiplier-accumulator banks 42, 43 and quadrature real and imaginary multiplier-accumulator banks 44, 45.

When the input signal bandwidth is at its maximum, the output sample rate of the in-phase and quadrature video filters 27, 28 are equal to the input sample rate and this structure implements an L-tap finite input response (FIR) filter. As the input signal bandwidth is decreased it is desirable to decrease the output sample rate proportionately requiring narrower in-phase and quadrature video filters 27, 28 and hence a longer impulse response. The filter structure shown in FIG. 4 supports this by simply adding additional coefficient storage. For a given multiplier-accumulator bank 42, 43, 44, 45 which implements an L tap FIR filter at the maximum rate, the impulse response length that may be implemented is equal to DL where D is the decimation ratio.

Referring to FIG. 4b, each multiplier-accumulator bank 42, 43, 44, 45 is comprised of a plurality (L) of multiplier-accumulators (MACs) 50a-50L that include a multiplier 51, a coefficient memory 52 coupled to the multiplier 51, an adder 53 coupled to an output of the multiplier 51, and a delay element 54 coupled to an output of the adder 53. The output of the delay element 54 of the first channel 50a is used as the input value for the adder 53. A switch 55 is selectively coupled between the output of the delay element 54 of a preceding processing channel (50a, for example) and the output of the delay element 54 of that particular processing channel (50b, for example), and so on for each of the remaining processing channels 50c-50L.

The basic operation of the filters 27, 28 is for each multiplier-accumulator 42, 43, 44, 45 to accumulate the output of the prior multiplier-accumulator (prior processing channel 50a, for example) together with D samples that are weighted (multiplied by coefficients using the multiplier 51 and coefficient memory 52) before passing the partial sum formed in the adder 53 to the next multiplier-accumulator stage (subsequent processing channel 50b, for example).

After passing through all L multiplier-accumulators (processing channels 50a-50L), D L samples have been weighted and summed, and are output from the analog signal converter 20.

The filters 23, 27, 28 may be dynamically programmed along with the delta-sigma modulator 21 to respond to varying carrier frequencies and signal bandwidths. In operation, the analog signal converter 20 is programmed by commanding the digital-to-analog converters 25 to center the noise shaping nulls of the delta-sigma modulator 21 around $F_c$. The null spacing is set to maximize the signal-to-noise ratio of the final digital output. The sample spacing at the serial-to-parallel converter 22 is set such that the sample times of the decimation filter 23 are set to sample the carrier in quadrature and the coefficients are programmed to form a bandpass filter at $F_c$.

The coefficients of the decimation filter 23 are selected to minimize aliased quantization noise of the delta-sigma modulator 21 taking advantage of the additional noise rejection provided by the in-phase and quadrature video filters 27, 28. The coefficients of the in-phase and quadrature video filters 27, 28 are programmed to form the bandpass filters at the decimated carrier frequency. The coefficients of the in-phase and quadrature video filters 27, 28 are selected to achieve the desired in-band response, control the image of the in-phase and quadrature approximation, equalize receiver response in multi-channel applications and suppress quantization noise. In general, the analog signal converter 20 produces in-phase and quadrature samples with some offset frequency that can be easily removed by subsequent processing.

The controller 26 for the analog signal converter 20 provides two levels of control, referred to as interphase and intraphase control. The interphase control provides the filter coefficients and parameters (i.e., the decimation ratio, D) that are held constant over phase (i.e., a set of transmitted pulses). The intraphase control provides a set of parameters that are used for each pulse repetition interval (PRI), where these parameters can change each pulse repetition interval to meet the needs of any radar mode.

These parameters include the "number of samples retained", the "number of samples not retained", and "fine sample adjustment" referred to with reference to FIGS. 4a and 4b.

Figure 5:
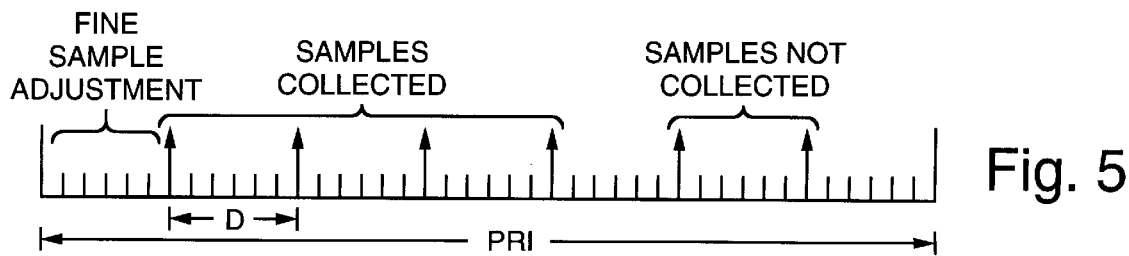
FIG. 5 illustrates a timeline of the output samples and which is useful in understanding FIGS. 4a and 4b.

FIG. 5 illustrates a timeline of the output samples showing the decimation ratio (D), the pulse repetition interval (PRI), the "number of samples retained", the "number of samples not retained", and the "fine sample adjustment" discussed with reference to FIGS. 4a and 4b.

Since the in-phase and quadrature video filters 27, 28 operate continuously the parameters number of samples retained and number of samples not retained control the gating of the output data to limit the output to only the desired data. The parameter "fine sample adjustment" is used to adjust the sampling when the pulse repetition interval is not a multiple of the sample period, DT, where D is the decimation ratio of the in-phase and quadrature video filters 27, 28 and T is the basic input rate to the in-phase and quadrature video filters 27, 28. This is required to insure that the output of the video filters 27, 28 remains aligned with the pulse repetition interval. Thus, every pulse repetition interval, the beginning of the formation of the video filters 27, 28 are delayed by the fine sample adjustment which serves to align the data. This delay is implemented by progressively delaying the transferring of data from one multiplier-accumulator (processing channel 50) to the next multiplier-accumulator (processing channel 50) and appropriately adjusting the addressing of the filter coefficient memory 52. This is done in a manner that prevents loss of data when the fine sample adjustment occurs. Thus, a programmable delta-sigma analog signal converter has been disclosed. It is to be understood that the described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A programmable delta-sigma analog signal converter comprising:

an oversampling delta-sigma modulator for sampling and quantizing an input signal comprising a bandlimited signal at a carrier frequency to a single bit;

a serial-to-parallel converter coupled to the delta-sigma modulator;

a digital decimation filter for digitally filtering the signal output of the delta-sigma modulator to produce an estimate of the baseband in-phase and quadrature components of the input signal;

in-phase and quadrature video filters for processing the output of the decimation filter to generate in-phase and quadrature samples that are output from the analog signal converter; and a plurality of digital-to-analog converters coupled to the delta-sigma modulator; and a controller coupled to the plurality of digital-to-analog converters for centering noise shaping nulls of the delta-sigma modulator around the carrier frequency, for setting the spacing between noise shaping nulls to maximize the signal-to-noise ratio of the digital output of the analog signal converter, and coupled to the decimation filter to set the sample times of the filter to sample the carrier in quadrature and coupled to the decimation filter for programming the coefficients thereof to form a bandpass filter at the carrier frequency and coupled to the in-phase and quadrature video filters for programming the coefficients thereof to form bandpass filters at the decimated carrier frequency.

2. The analog signal converter of claim 1 wherein the coefficients of the decimation filter are selected to minimize the aliased quantization noise of the delta-sigma modulator.

3. The analog signal converter of claim 1 wherein coefficients of the in-phase and quadrature video filters video filters are selected to provide a desired in-band response, control the image of the in-phase and quadrature approximation, and suppress quantization noise.

4. The analog signal converter of claim 1 wherein the serial-to-parallel converter and decimation filter comprise:

an N bit shift register for receiving the single bit serial output stream of the delta-sigma modulator and for converting it to an N bit parallel word;

a lookup table that is addressed by the N bit parallel word; and an adder for adding outputs of the addressed lookup table to generate the estimate of the baseband in-phase and quadrature components that are output to the in-phase and quadrature video filters.

5. The analog signal converter of claim 4 wherein the lookup table comprises a plurality of lookup tables that individually output a plurality of partial sums.

6. The analog signal converter of claim 1 wherein the in-phase and quadrature video filters each comprise:

in-phase real, in-phase imaginary, quadrature real and quadrature imaginary multiplier-accumulator banks that each comprise a plurality of processing channels that include a multiplier, a coefficient memory coupled to the multiplier, an adder coupled to an output of the multiplier, and a delay element coupled to an output of the adder, and a switch that is selectively couples the output of the delay element of a preceding processing channel and the output of the adder of that processing channel; a first adder coupled to the in-phase real and the quadrature imaginary multiplier-accumulator banks for outputting the in-phase digital video signal; and a second adder coupled to the quadrature real and the in-phase imaginary multiplier-accumulator banks for outputting the quadrature digital video signal.

7. The analog signal converter of claim 1 wherein the controller provides interphase control comprising filter coefficients and a decimation ratio that are held constant, and intraphase control comprising a set of parameters that can change for each pulse repetition interval.

8. The analog signal converter of claim 1 wherein the intraphase control parameters include the number of samples retained, the number of samples not retained, and the fine sample adjustment.

\* \* \* \* \*